(12) United States Patent
Kim

(10) Patent No.: US 6,524,883 B2
(45) Date of Patent: Feb. 25, 2003

(54) QUANTUM DOT OF SINGLE ELECTRON MEMORY DEVICE AND METHOD FOR FABRICATING THEREOF

(75) Inventor: Il-Gweon Kim, Choongcheongbuk-Do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 39 days.

(21) Appl. No.: 09/929,511

(22) Filed: Aug. 15, 2001

(65) Prior Publication Data

US 2002/0031649 A1 Mar. 14, 2002

(30) Foreign Application Priority Data

Aug. 31, 2000 (KR) .......................................... 2000-51218

(51) Int. Cl.[7] .......................... H01L 21/00; H01L 21/84; H01L 21/336
(52) U.S. Cl. .......................... 438/94; 438/165; 438/301; 438/302
(58) Field of Search ..................... 438/22, 94, 165, 438/301, 97, 300, 302

(56) References Cited

U.S. PATENT DOCUMENTS

| | | | |
|---|---|---|---|
| 5,801,401 A | * | 9/1998 | Forbes .......................... 257/314 |
| 6,103,600 A | * | 8/2000 | Ueda et al. .................... 438/22 |
| 6,194,237 B1 | * | 2/2001 | Kim et al. ..................... 438/22 |
| 6,346,431 B1 | * | 2/2002 | Yoo et al. ...................... 438/94 |
| 6,346,436 B1 | * | 2/2002 | Fukushima et al. .......... 438/165 |
| 6,351,007 B1 | * | 2/2002 | Fukushima et al. ........... 257/14 |
| 6,351,411 B2 | * | 2/2002 | Forbes et al. ................ 365/178 |
| 6,375,737 B2 | * | 4/2002 | Shih et al. ..................... 117/11 |
| 2001/0034072 A1 | * | 10/2001 | Zhang et al. .................. 438/22 |

OTHER PUBLICATIONS

Oliver G. Schmidt and Karl Eberl, "Self-Assembled Ge/Si Dots for Faster Field-Effect Transistors", Jun. 2001, IEEE Transactions on Electron Devices, vol. 48, No. 6, pp. 1175–1179.*

* cited by examiner

Primary Examiner—John F. Niebling
Assistant Examiner—Walter L. Lindsay, Jr.
(74) Attorney, Agent, or Firm—Fleshner & Kim, LLP

(57) ABSTRACT

A method for fabricating a quantum dot, which can be used to fabricate a single electron memory device. The method includes forming a first insulation layer on a semiconductor layer, then forming a second insulation layer on the first insulation layer. Next, the second insulation layer is patterned to form an opening to partially expose the upper surface of the first insulation layer. Using the opening in the second insulation layer, a silicon ion is then implanted into the first insulation layer through the opening by using a tilt angle ion implantation method. Finally, the semiconductor layer is treated to re-crystallize the silicon ion implanted into the first insulation layer.

24 Claims, 6 Drawing Sheets

QUANTUM DOT OF SINGLE ELECTRON MEMORY DEVICE AND METHOD FOR FABRICATING THEREOF

BACKGROUND OF THE INVENTION

1. Field of the Invention

The present invention relates to a semiconductor device and a method for fabricating thereof, and more particularly, to a single electron semiconductor device and method thereof.

2. Background of the Related Art

In response to the semiconductor industry's desire to further integrate semiconductor devices, a single electron memory device has been developed which is programmable and erasable by using just a single or a few electrons.

FIG. 1 shows a structure of a single electron memory device in accordance with the related art where a semiconductor layer 100 made of silicon or gallium-arsenic (GaAs) is formed with a tunneling insulation film 102 on the upper surface of the semiconductor layer 100. The tunneling insulation film 102 is formed by a silicon oxide film having a thickness of 2–3 nm. Next, a quantum dot 104 is formed on the upper surface of the tunneling insulation film 102 of a fine-sized polycrystalline silicon pattern having a width of about 50 nm and a height of about 50 nm. The size of the quantum dot 104 is preferably such that a single electron or several electrons at the most can tunnel to generate a Coulomb Blockade phenomenon.

A control insulation film 106 is formed on the upper surface of the quantum dot 104. The control insulation film 106 is a silicon oxide film or a silicon nitride film formed with a thickness of about 2–3 nm. Next, a control gate electrode 108 is formed on the upper surface of the control insulation film 106.

An n-type or a p-type of impurity ion-implanted source region 110 and a drain region. 112 are formed in the semiconductor layer 100 at the both sides of the control gate electrode 108. Then, an interlayer insulation film 114 is formed at the upper surface and side surface of the control gate electrode 108, and a planarization layer 116 is formed on the upper surface of the interlayer insulation film 114. A contact hole 117 is then formed on the upper surface of the source region 110 and the drain region 112 and a conductive plug 118 is formed through the contact hole 117, where the conductive plug is connected with a metal wiring layer 120.

The operational principle of a single electron memory having the construction of FIG. 1 is the same as that of an EEPROM (Electrically Erasable Programmable Read Only Memory) of the related art. But, unlike an EEPROM of the related art, the single electron memory can vary a threshold voltage with merely single electron or several electrons at the most and is operable at a lower voltage than a EEPROM of the related art because when a write voltage higher than the threshold voltage is applied to the control gate electrode, an inversion layer is formed in a channel region and an electron from the source region is induced into the channel, reducing the channel conductance.

This occurs because one or several electrons when in the inversion layer of the channel region, tunnel into the quantum dot (which becomes a floating gate) and one by one the electrons tunnel through a thin tunneling insulation layer at room temperature. As the electrons tunnel into the floating quantum dot, the threshold voltage changes.

Ideally, it is preferred that a single electron tunnels for programming. However, since it is difficult to detect the change in the size of the threshold voltage, three or four electrons are often used to change the threshold voltage by about 1V to program the memory.

FIGS. 2A through 2H show a series of processes of the method for fabricating a single electron memory device in accordance with the related art.

As shown in FIG. 2A, a plurality of device isolation regions 201 are formed at predetermined portions of a semiconductor layer 200. The device isolation regions 201 are called field regions and the other regions which are not the device isolation regions 201 are called active regions. Next, a tunneling insulation layer 202 is formed on an upper surface of the semiconductor layer 200 including the field region 201, then a polysilicon layer 203 is formed on the upper surface of the tunneling insulation layer 202.

As shown in FIGS. 2B and 2C, the polysilicon layer 203 is patterned to form a polysilicon layer pattern 203a, the surface of the polysilicon layer pattern 203a is oxidized to form a silicon oxide film 204 on the surface of the polysilicon layer pattern 203a as illustrated in FIG. 2C. Thereafter, as shown in FIG. 2D, the silicon oxide film 204 is selectively etched using a buffered HF solution to reduce the polysilicon layer pattern 203a to a smaller size polysilicon layer pattern 203B.

The processes of FIGS. 2C and 2D are repeatedly performed until, as shown in FIG. 2E, a quantum dot 203c is formed having a length that is at most 50 nm. Next, as shown in FIG. 2F, a control insulation film 205 is formed on the upper surface of the polysilicon layer pattern 203c, the tunneling insulation layer 202 and the isolation regions 201, and then a polysilicon layer 206 is deposited on the upper surface of the a control insulation film 205.

Next, as shown in FIG. 2G, the polysilicon layer 206 and the control insulation film 205 are patterned to form a control gate electrode 206a, source 207 and drain regions 208 are then formed on both sides of the control gate electrode 206a by implanting an impurity ion into the semiconductor layer 200, and an interlayer insulation film 209 is formed on the entire upper surface of the structure formed on the semiconductor layer 200. Then, a planarization layer 210 is formed on the upper surface of the interlayer insulation film 209, a contact hole is then formed on both the source 207 and drain regions 208 and each contact hole is filled with a conductive material to form a conductive plug 211 as shown in FIG. 2H. Finally, a metal wiring layer 212 is formed on the upper surface of the conductive plug 211, thereby completing the fabricating of a single electron dot memory device.

However, the above method for fabricating a single electron memory device has various problems. For example, a very fine pattern must formed to form the quantum dot, but the smallest line feature that can currently be formed by using the currently available photolithography processes are about 0.1 μm. Accordingly, it is difficult to fabricate a quantum dot having a size less than 50 nm by using the currently available photolithography and an etching process which starts with pattern line features of about 0.1 μm.

Further, as mentioned above in the related art method, a comparatively large A polysilicon layer pattern is formed, and then the size of the polysilicon layer pattern is reduced by using iterations of oxidation and wet etching. Accordingly, this method has a problem with the evenness of the size of the quantum dot because of the inexactness of the oxidation and wet etching and a problem with the reproduction of the process because of the iterations of oxidation and wet etching required to reduce the size of the quantum dot.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a quantum dot having a more consistent size.

Another object of the present invention is to provide a quantum dot having an improved reproductiveness of the process.

A further object of the present invention is to provide a single electron memory device.

To achieve these and other advantages and in accordance with the purpose of the present invention, as embodied and broadly described herein, there is provided a method for fabricating a quantum dot including the steps of forming a first insulation layer on a semiconductor layer, forming a second insulation layer on the first insulation layer, patterning the second insulation layer to form an opening of 'T'-shape and partially exposing the upper surface of the first insulation layer, implanting a silicon ion into the first insulation layer through the opening by using a tilt angle ion implantation method, thermally treating the semiconductor layer to re-crystallize the silicon ion implanted into the first insulation film.

In order to achieve the above objects, in the above method for fabricating a quantum dot, the recrystallizing refers to a thermal treatment of the semiconductor layer at a temperature of about 600~700° C.

In order to achieve the above objects, in the above method for fabricating a quantum dot, the first insulation film is a silicon oxide film.

In order to achieve the above objects, in the above method for fabrcating a quantum dot, in the step of forming the first insulation film, the first insulation film has the thickness of about 30 nm.

In order to achieve the above objects, in the above method for fabricating a quantum dot, in the step of implanting the silicon ion, the silicon ion is implanted with the depth of about 5 nm from the upper surface of the silicon oxide film.

In order to achieve the above objects, in the above method for fabricating a quantum dot, the second insulation film is a nitride film.

In order to achieve the above objects, in the above method for fabricating a quantum dot, the nitride film has the thickness of about 30 nm.

In order to achieve the above objects, there is also provided a method for fabricating a single electron memory device including the steps of forming a first insulation layer on a semiconductor layer, forming a second insulation layer on the first insulation layer, patterning the second insulation layer to form an opening of 'T'-shape and partially exposing the upper surface of the first insulation layer, implanting a silicon ion into the first insulation layer through the opening by using a tilt angle ion implantation method, thermally treating the semiconductor layer to re-crystallize the silicon ion implanted into the first insulation film and forming a quantum dot, removing the second insulation film, forming a control gate electrode of polysilicon layer pattern on the upper surface of the first insulation film, patterning the first insulation film to have the same size of the control gate electrode, and forming a source and a drain regions in the semiconductor layer at both sides of the control gate electrode.

In order to achieve the above objects, in the above method for fabricating a single electron memory device, the re-crystallizing refers to a thermal treatment of the semiconductor layer at a temperature of about 600~700° C.

In order to achieve the above objects, in the above method for fabricating a single electron memory device, the first insulation film is a silicon oxide film.

In order to achieve the above objects, in the above method for fabricating a single electron memory device, in the step of forming the first insulation film, the first insulation film has the thickness of about 30 nm.

In order to achieve the above objects, in the above method for fabricating a single electron memory device, in the step of implanting the silicon ion, the silicon ion is implanted with the depth of about 5 nm from the upper surface of the silicon oxide film.

In order to achieve the above objects, in the above method for fabricating a single electron memory device, the second insulation film is a nitride film.

In order to achieve the above objects, in the above method for fabricating a single electron memory device, the nitride film has the thickness of about 30 nm.

In order to achieve the above objects, in the above method for fabricating a single electron memory device, in the step of removing the nitride film, the nitride film is removed by using a hot phosphoric acid solution by wet etching.

In order to achieve the above objects, in the above method for fabricating a single electron memory device, in the step of implanting the silicon ion, the silicon ion is implanted into the first insulation film so that the concentration of the silicon ion is $10^{21}$ atoms/cm$^3$.

In order to achieve the above objects, in the above method for fabricating a single electron memory device, the quantum dot has the diameter of about 10 nm.

To further achieve the above objects, a method for fabricating a quantum dot includes forming a first insulation layer on an upper surface of a semiconductor layer, forming a second insulation layer on an upper surface of the first insulation layer, patterning the second insulation layer to form an opening to partially expose the upper surface of the first insulation layer, implanting an ion into the first insulation layer through the opening by using a tilt angle ion implantation method, andrecrystallizing the implanted ion in the first insulation layer.

To further achieve the above objects, a method for fabricating a single electron memory device includes forming a first insulation layer on an upper surface of a semiconductor layer, forming a second insulation layer on an upper surface of the first insulation layer, patterning the second insulation layer to form an opening to partially expose the upper surface of the first insulation layer, implanting an ion into the first insulation layer through the opening by using a tilt angle ion implantation method, recrystallizing the ion implanted into the first insulation layer and forming a quantum dot, removing the second insulation layer, forming a control gate electrode on the upper surface of the first insulation layer, patterning the first insulation layer to the same width as the control gate electrode, and forming source and drain regions in the semiconductor layer at both sides of the control gate electrode.

To further achieve the above objects, a single electron memory device includes a semiconductor layer, a first insulation layer on an upper surface of the semiconductor layer, a second insulation layer on an upper surface of the first insulation layer, and a recrystallized implanted ion in the first insulation layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

FIGS. 3A through 3F illustrate a preferred embodiment method of the present invention for fabricating a single electron memory device and a preferred embodiment method for fabricating a quantum dot.

Figure 1:
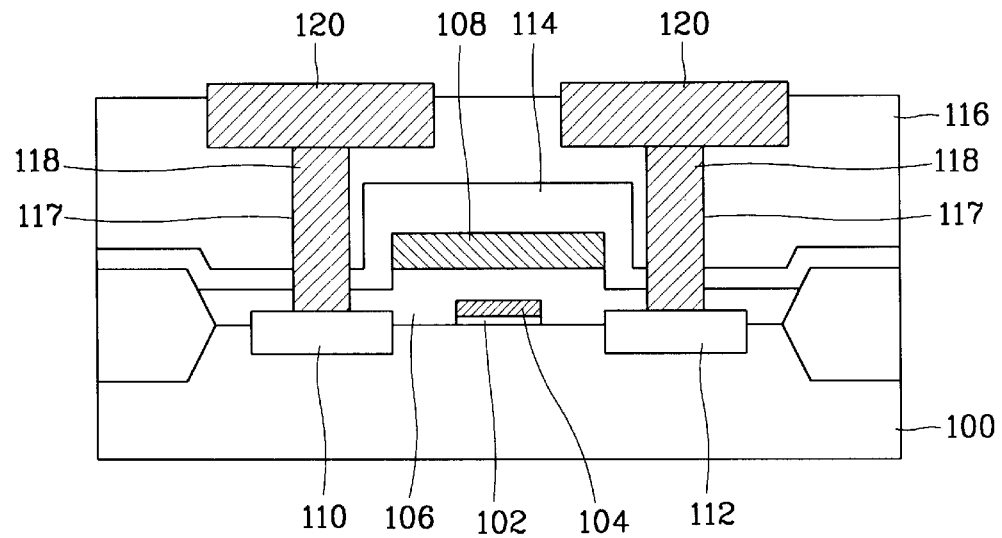
FIG. 1 shows a structure of a single electron memory device in accordance with a conventional art.
Figure 2A:
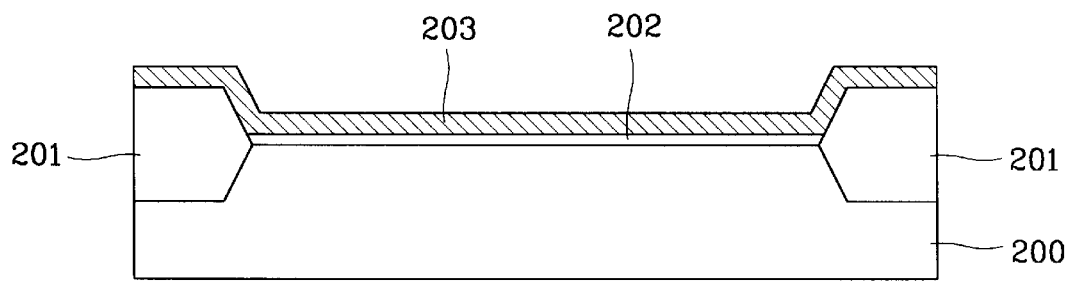
FIGS. 2A through 2H show a series of processes of the method for fabricating a single electron memory device in accordance with the conventional art.
Figure 2B:
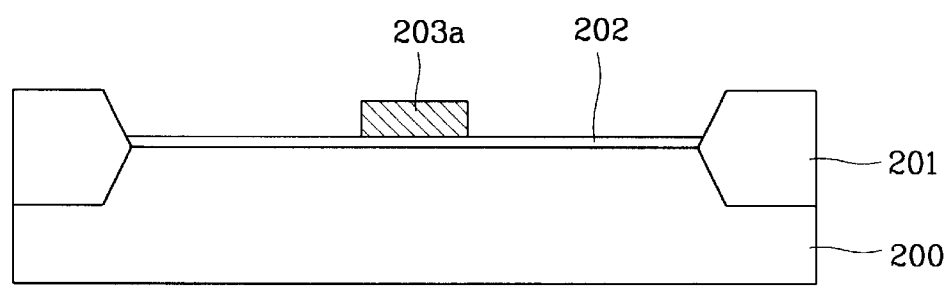
Figure 2C:
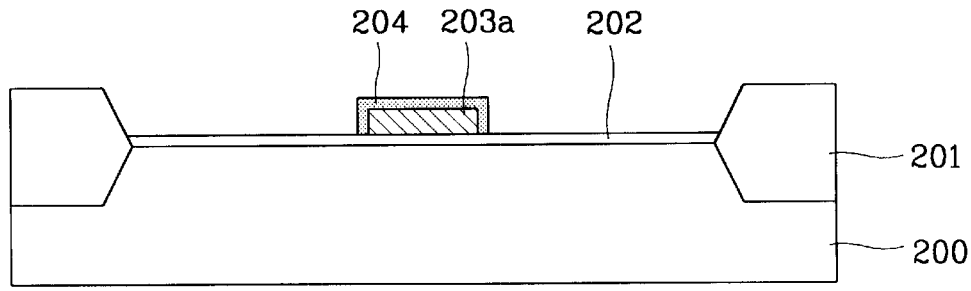
Figure 2D:
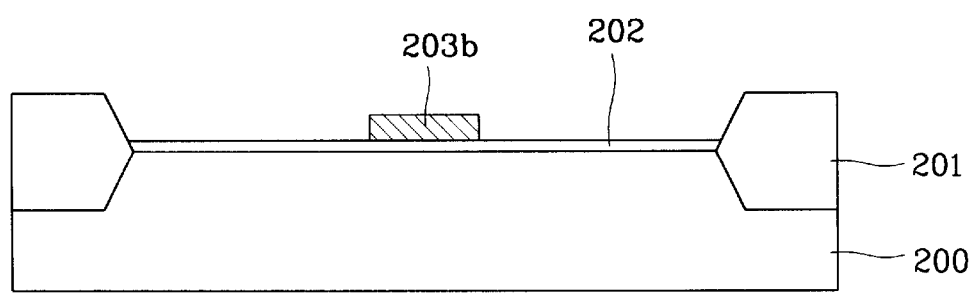
Figure 2E:
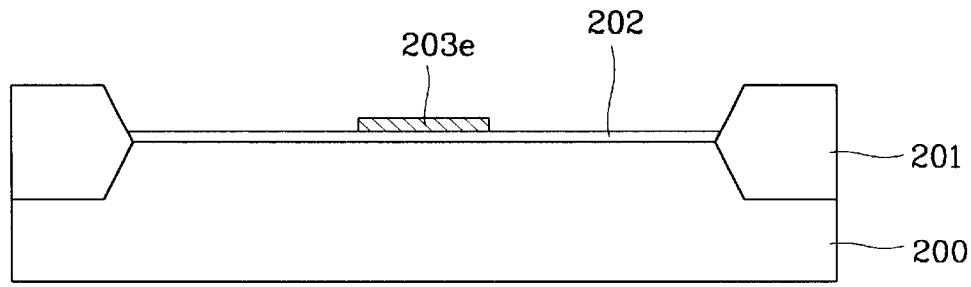
Figure 2F:
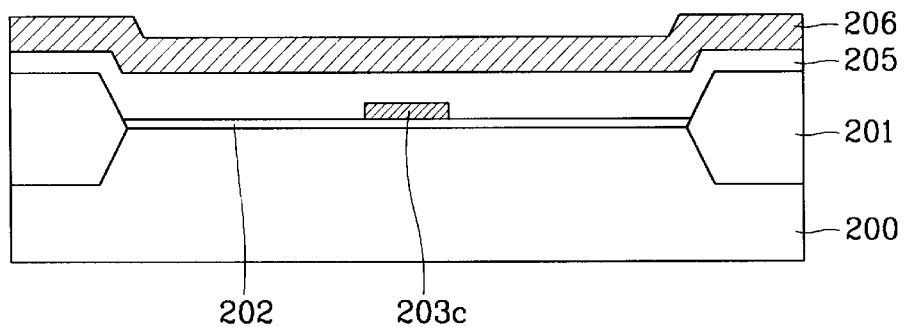
Figure 2G:
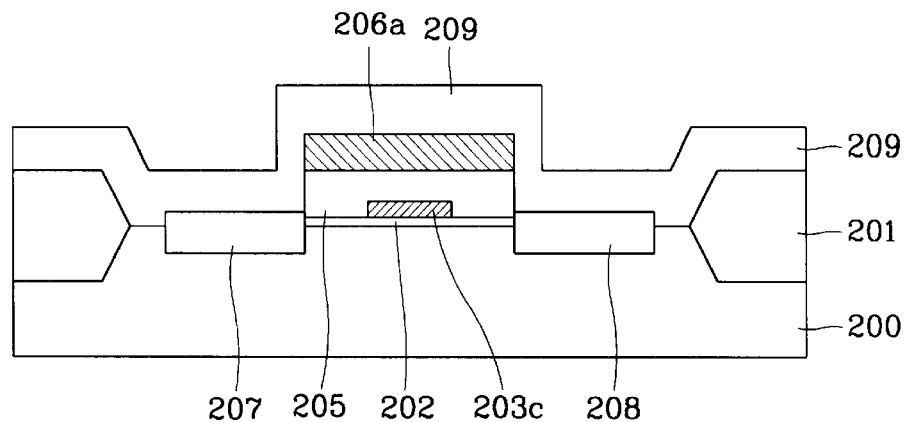
Figure 2H:
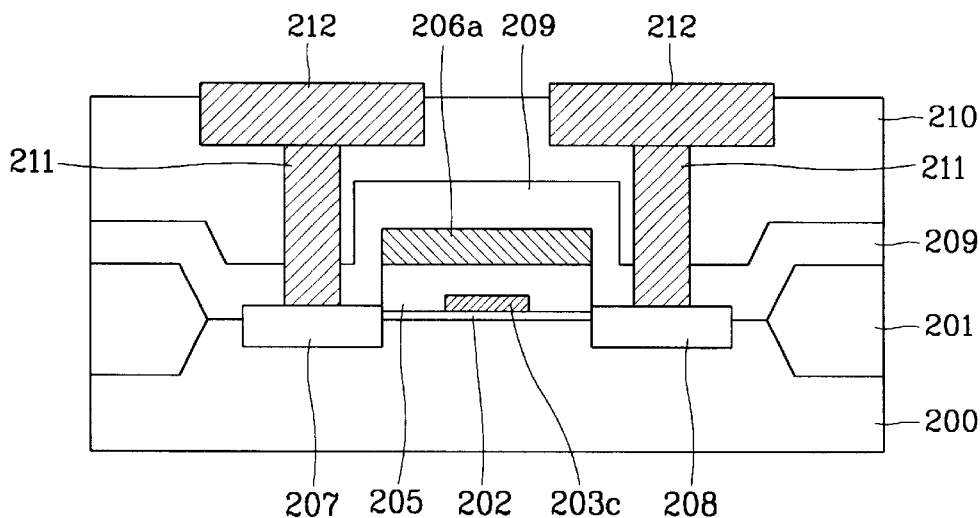
Figure 3A:
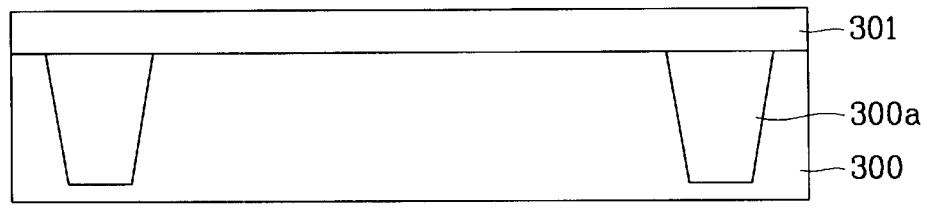
FIGS. 3A through 3F show a series of processes of a method for fabricating a single electron memory device and of a method for fabricating a quantum dot in accordance with the present invention.

In FIG. 3A, a device isolation region 300a is formed in a semiconductor layer 300, then a silicon oxide film 301 is formed on the upper surface of the semiconductor layer 300, where the silicon oxide film 301 has a thickness of about 30 nm.

Figure 3B:
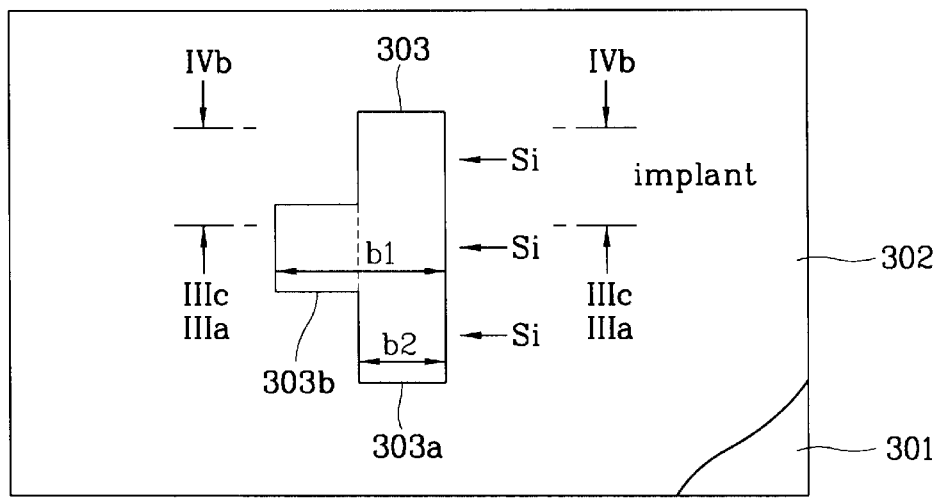

Next, as illustrated in FIG. 3B, a nitride film 302 having the thickness of more than 300 nm is formed on the silicon oxide film 301, then an opening 303 is formed by partially etching the nitride film 302, which exposes the upper surface of the silicon oxide film 301. The opening 303 is preferably formed in a 'T' shape with a long axis pattern 303a, and a short axis pattern 303b where the short axis pattern is formed protrusively from the central portion of the long axis pattern 303a. The opening can be any shape which meets the requirements of a tilt angle ion implantation such as "L", "E", etc.

Figure 4A:
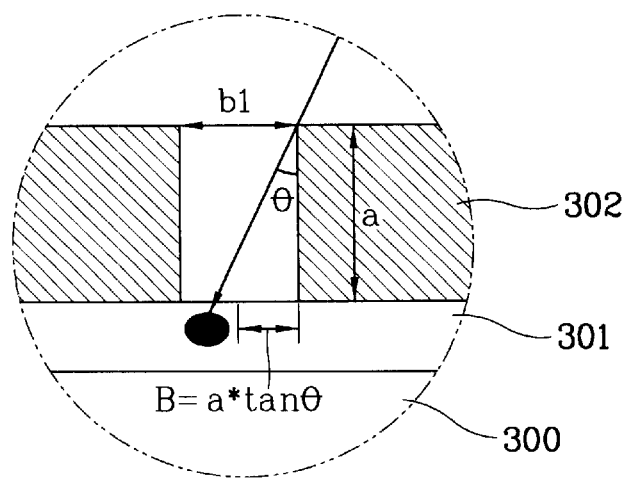
Figure 4B:
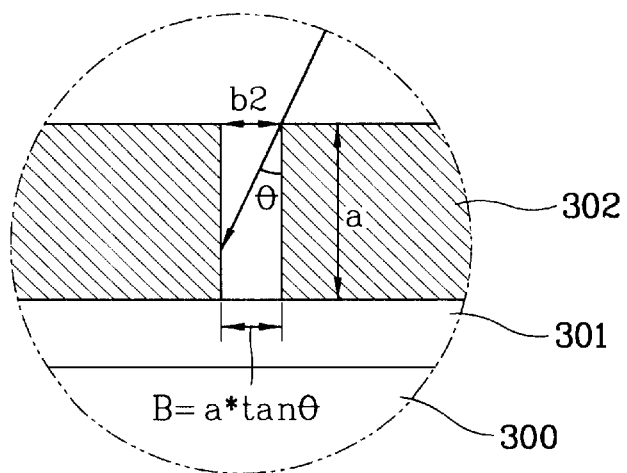

Referring to FIG. 4B, the thickness of the nitride film pattern is denoted by 'a'. Preferably, the longest portion b1 of the pattern of the opening 303 is equal to the value obtained by adding the width of the long axis pattern 303a and the length of the short axis pattern 303b, and the short length b2 is the same as the width of the long axis pattern 303a. The length of each axis pattern being the relatively longer side, while the width of each axis pattern being the relatively shorter side.

Figure 3C:
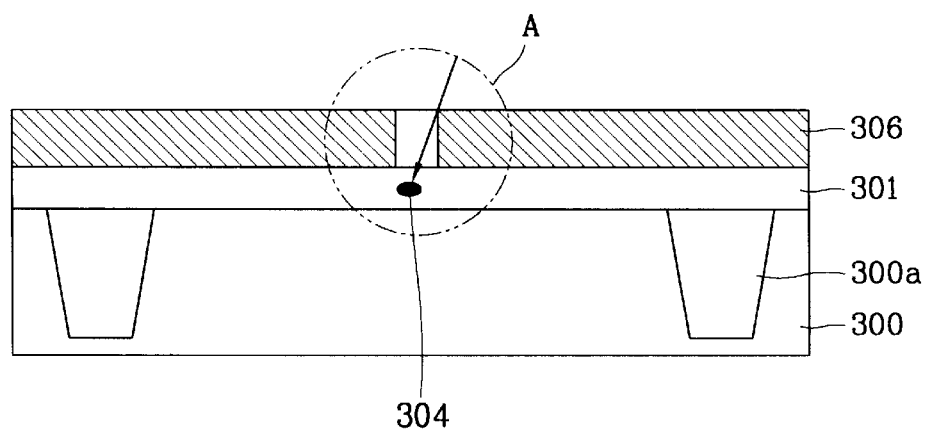

FIG. 3C is a sectional view taken along line of IIc—IIIc of FIG. 3B. As shown in FIG. 3C, silicon ions are implanted into the silicon oxide film 301 through the opening 303 by using a tilt angle ion implantation method having a tilt angle of θ to form a silicon ion implantation region 304. Any suitable ion for a quantum dot may also be adequate. The silicon ion implantation region 304 is formed only in the silicon oxide film 301 which is related to the short axis pattern 303b. That is, ion implantation shadowing occurs in the portion of the long axis pattern 303a of the opening 303, due to the tilt angle ion implantation such that the shadowed silicon ions, or the ions not implanted through the opening 303, are implanted into the silicon nitride film 302, rather than into the silicon oxide film 301.

For the convenience of understanding a more detailed description thereon will now be given with reference to FIGS. 4A and 4B.

FIG. 4A is an enlarged view of the portion indicated by a circle 'A' of FIG. 3C. An ion implantation shadowing region length B is determined by the thickness a of the nitride film 302 and the ion implantation tilt angle θ, as expressed by $B=a*\tan(\theta)$. Accordingly, the silicon ion can be implanted into the silicon oxide film only when the lengths (b1) of the opening are greater than the length of the ion implantation shadowing region B.

As shown in FIG. 4A, since the length of the opening b1 is greater than the length of the ion implanting region B or $a*\tan(\theta)$, the silicon ions are implanted into the silicon oxide film 301, thus forming a quantum dot. As shown in FIG. 4B, which is a vertical-sectional view taken along line of IVb–IVb of FIG. 3B, the length of the opening b2 is not greater than the length of the ion implanted shadowing region B or $a*\tan(\theta)$, therefore the silicon ions are implanted on the nitride film 302 and not implanted into the silicon oxide film 301 and do not form a quantum dot. Therefore, in FIG. 4A, ions are implanted into the silicon oxide film 301 to form a quantum dot, but in FIG. 4B are not implanted into the silicon oxide film 301 and therefore a quantum dot is not formed.

In a preferred embodiment of the present invention the size of silicon ion implanted region B, the length of the opening b1, b2, the tilt angle θ in ion implanting and the thickness a of the nitride film are determined to coincide with a nitride film which has a thickness of about 30 nm for a single electron memory device. Also preferably, the strength of the ion implantation energy is set so that the silicon ion implanted region 304 is formed at a depth of about 5 nm from the upper surface of the silicon oxide film 301, since the silicon oxide film 301 at the upper portion of the silicon ion 304 becomes a tunneling oxide film and the thickness of the tunneling oxide film is set depending on the depth at which the silicon ion is implanted.

In the present invention, in order for the tunneling oxide film to have the thickness of 5 nm, ion implantation is carried out so that the silicon ion can be distributed at the depth of about 5 nm from the upper surface of the silicon oxide film 301. Also, the concentration of the silicon ion in the silicon ion implanted region 304 is preferably about on the order of $10^{21}$ atoms/cm$^3$.

Figure 3D:
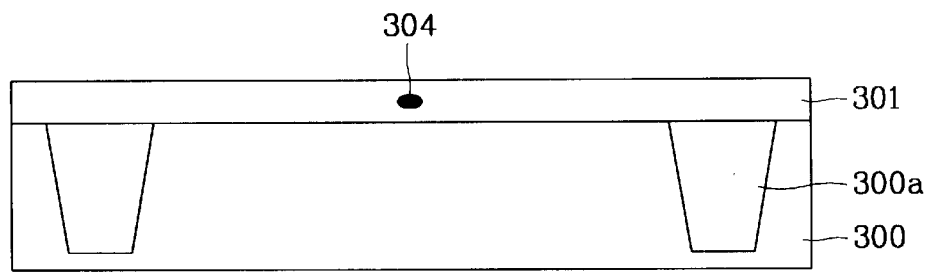
Figure 3E:
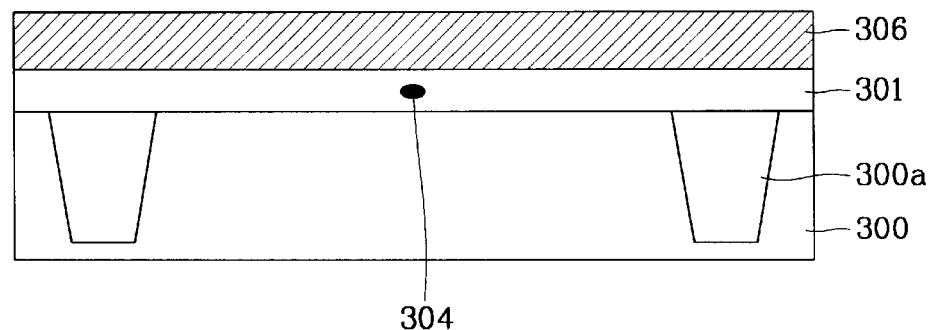

Next, as shown in FIG. 3D, the nitride film 302 is preferably removed by using a hot phosphoric acid solution, then the semiconductor layer 300 is preferably subjected to a thermal treatment, which causes the silicon ions in the silicon ion implanted region 304 to recrystallize where the temperature for the thermal treatment is preferably about 700~800° C. After undergoing the recrystallizing process, the silicon ions are recrystallized, forming a silicon quantum dot having the diameter of less than about 10 nm. Next, as shown in FIG. 3E, a polysilicon layer 306 is formed on the upper surface of the silicon oxide film 301.

Figure 3F:
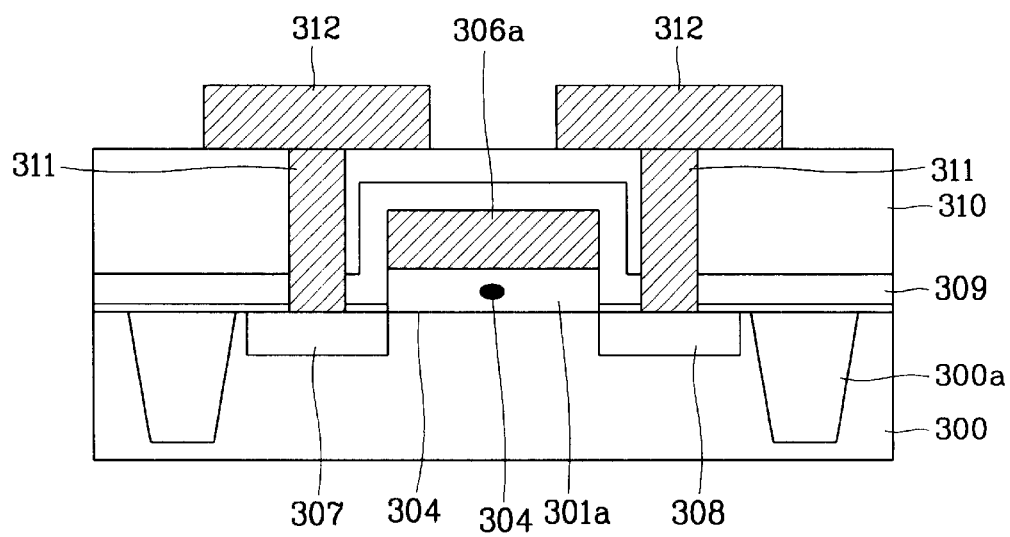

Then, as shown in FIG. 3F, the polysilicon layer 306 is patterned to form a control gate electrode 306a, and the silicon oxide film 301 is patterned to form a tunneling insulation film 301a. Next, an impurity ion is implanted into the semiconductor layer 300 using the control gate electrode 306a as a mask, thereby forming a source region 307 and a drain region 308 on both sides of the control gate electrode 306a.

Thereafter, an interlayer insulation film 309, which is preferably a silicon at oxide film, is formed on the upper surface of the source 307 and the drain regions 308 and the upper surface of the control gate electrode 306a preferably by a vapor deposition method. Next, a planarization layer 310 is formed on the upper surface of the interlayer insulation film 309.

Next, the planarization layer 310 and the interlayer insulation film 309 are selectively etched to form contact holes at the upper surface of the source 307 and the drain regions 308 and then the contact holes are filled with a conductive material, thereby forming conductive plugs 311. Finally, a metal wiring 312 is formed-on the upper surface of the conductive plug 311 and the upper surface of the planarization layer 310, thereby completing the fabrication of a single electron device.

The method for fabricating a quantum dot and a device thereof, as described above, lead to a consistent quantum dot size and an improved reproductiveness for fabricating a quantum dot. This in turn leads to improved reliability of a single electron memory device. Further, since a quantum dot having a size of less than 10 nm can be fabricated, a stable Coulomb Blockade phenomenon can occur even at a room temperature, so that an ultra-highly integrated memory of more than 4 Gbit can be fabricated by adopting the present invention. Moreover, since the quantum dot has a very small size and the tunneling insulation film is very thin, the single electron memory device is operable even at a very low voltage and is quick about programming and erasing.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a quantum dot, comprising:

forming a first insulation layer on an upper surface of a semiconductor layer;

forming a second insulation layer on an upper surface of the first insulation layer;

patterning the second insulation layer to form an opening to partially expose the upper surface of the first insulation layer;

implanting an ion into the first insulation layer through the opening by using a tilt angle ion implantation method; and recrystallizing the implanted ion in the first insulation layer.

2. The method according to claim 1, wherein the formation of the opening comprises:

a long axis pattern; and a short axis pattern, wherein the short axis pattern is formed protrusively from a central portion of the long axis pattern.

3. The method according to claim 1, wherein the implanted ion comprises silicon ions.

4. The method according to claim 3, wherein the silicon ions are implanted into the first insulation layer at a concentration on the order of $10^{21}$ atoms/cm$^3$.

5. The method according to claim 1, wherein the recrystallizing of the implanted ion comprises thermal treatment of the semiconductor layer at a temperature of about 600~700° C.

6. The method according to claim 1, wherein the first insulation layer comprises silicon oxide.

7. The method according to claim 1, wherein the first insulation layer is formed to a thickness of about 30 nm.

8. The method according to claim 1, wherein the ion is implanted with a depth of about 5 nm from an upper surface of the first insulation layer.

9. The method according to claim 1, wherein the second insulation layer comprises a nitride film.

10. The method according to claim 9, further comprising removing the nitride film by wet etching using a hot phosphoric acid solution.

11. The method according to claim 1, wherein the second insulation layer is formed to a thickness of about 30 nm.

12. The method according to claim 1, wherein the quantum dot is formed to a diameter of about 10 nm.

13. A method for fabricating a single electron memory device, comprising:

forming a first insulation layer on an upper surface of a semiconductor layer;

forming a second insulation layer on an upper surface of the first insulation layer;

patterning the second insulation layer to form an opening to partially expose the upper surface of the first insulation layer;

implanting an ion into the first insulation layer through the opening by using a tilt angle ion implantation method;

recrystallizing the ion implanted into the first insulation layer and forming a quantum dot;

removing the second insulation layer;

forming a control gate electrode on the upper surface of the first insulation layer;

patterning the first insulation layer to the same width as the control gate electrode; and forming source and drain regions in the semiconductor layer at both sides of the control gate electrode.

14. The method according to claim 13, wherein the formation of the opening comprises:

a long axis pattern; and a short axis pattern, wherein the short axis pattern is formed protrusively from a central portion of the long axis pattern.

15. The method according to claim 13, wherein the implanted ion comprises silicon ions.

16. The method according to claim 15, wherein the silicon ions are implanted into the first insulation layer at a concentration on the order of $10^{21}$ atoms/cm$^3$.

17. The method according to claim 13, wherein the recrystallizing of the implanted ion comprises thermal treatment of the semiconductor layer at a temperature of about 600~700° C.

18. The method according to claim 13, wherein the first insulation layer comprises silicon oxide.

19. The method according to claim 13, wherein the first insulation layer is formed to a thickness of about 30 nm.

20. The method according to claim 13, wherein the ion is implanted with a depth of about 5 nm from an upper surface of the first insulation layer.

21. The method according to claim 13, wherein the second insulation layer comprises a nitride film.

22. The method according to claim 21, further comprising removing the nitride film by wet etching using a hot phosphoric acid solution.

23. The method according to claim 13, wherein the second insulation layer is formed to a thickness of about 30 nm.

24. The method according to claim 13, wherein the quantum dot is formed to a diameter of about 10 nm.

* * * * *